United States Patent
Lee et al.

(10) Patent No.: US 8,332,170 B2
(45) Date of Patent: Dec. 11, 2012

(54) APPARATUS AND METHOD FOR DETECTING ARCS

(75) Inventors: Kang Lee, Siheung-si (KR); Sang Jeen Hong, Gyeonggi-do (KR); Sang Youl Lee, Siheung-si (KR); Jong Hwan Ahn, Seoul (KR)

(73) Assignee: Hwaback Engineering Co., Ltd., Gyeonggi-Do (KR)

( * ) Notice: Subject to any disclaimer, the term of this patent is extended or adjusted under 35 U.S.C. 154(b) by 407 days.

(21) Appl. No.: 12/772,565

(22) Filed: May 3, 2010

(65) Prior Publication Data

US 2011/0040508 A1 Feb. 17, 2011

(30) Foreign Application Priority Data

Aug. 12, 2009 (KR) ........................ 10-2009-0074463

(51) Int. Cl.
*G06F 19/00* (2011.01)

(52) U.S. Cl. ......................................................... 702/66
(58) Field of Classification Search .................... 702/66, 702/67, 182–185
See application file for complete search history.

(56) References Cited

U.S. PATENT DOCUMENTS

2009/0022420 A1* 1/2009 Kondo et al. ................. 382/276

* cited by examiner

*Primary Examiner* — Edward Raymond
(74) *Attorney, Agent, or Firm* — IPLA P.A.; James E. Bame (57) ABSTRACT

The apparatus for detecting arc occurred in chamber for plasma treatment used for manufacturing semiconductor or LCD panel comprises, a sensor module for sensing the arc; a processor module for processing data from the sensor module; wherein the sensor module includes RGB color sensor for sensing color data of the arc occurred in the chamber, the RGB color sensor is a sensor sensable at least one of red color or green color or blue color of the arc, the apparatus detects the arc by sensing data of color and chroma and brightness of the arc.

22 Claims, 6 Drawing Sheets

APPARATUS AND METHOD FOR DETECTING ARCS

CROSS REFERENCE

This application claims foreign priority under Paris Convention and 35 U.S.C. §119 to Korean Patent Application No. 10-2009-0074463, filed Aug. 12, 2009 with the Korean Intellectual Property Office.

BACKGROUND OF THE INVENTION

1. Technical Field

The present invention relates to an apparatus and method for detecting arc, more specifically to an apparatus and method for detecting arc in which by sensing arc occurred in process chamber for plasma treatment with RGB color sensor portion, color data of the arc can be obtained at high speed.

2. Description of the Related Art

Generally, apparatus for plasma treatment is widely used in semiconductor manufacturing process, liquid crystal display panel manufacturing process, solar cell manufacturing process, surface treatment process of material, treatment for atmospheric pollution, nuclear fusion and the like.

Particularly, plasma treatment apparatus used for manufacturing semiconductor generally uses RF electric source for producing plasma, and in plasma treatment process, if there are structural defect or small particles in process chamber, arc deteriorating stability of plasma treatment process may occur.

Particularly, in a plasma treatment apparatus used for manufacturing semiconductor, it is difficult to find out in which element of a wafer defect is occurred by the arc, and the arc may produce other small particles causing defects of element in next process.

By this, for monitoring stability of the plasma treatment process, technique for monitoring occurrence of arc in process chamber is demanded.

Detecting of the arc was performed by apparatus for detecting arc by monitoring RF signals in process chamber.

However, method for detecting arc using the RF signal has the problem that by the method it is difficult to catch prelude phenomenon in which signal of specific intensity is detected before occurrence of arc, because the method is a type merely counting variation value of RF signal frequency.

That is, the method of detecting arc using RF signal can detect only occurrence of arc, so there is a limit to figure out the characteristic of the arc and analysis of the arc.

Accordingly, to solve said problem and at the same time to figure out prelude phenomenon and characteristic of arc occurrence, method of monitoring arc through optical analysis of inside of the process chamber was developed.

The method is performed by installing CCD camera in the process chamber, and by analysis images photographed by the camera to detect arc.

However, the method for detecting arc with the CCD camera stores to analyze images of inside of the process chamber photographed by the camera, size of data to be stored is very large (10 Gbyte per hour), and number of images to be analyzed is very large, so it makes it difficult to detect arc effectively and easily.

Accordingly, it is demanded to develop a technique for solving said problem, and enabling easy monitoring for arc, to figure out prelude phenomenon and characteristic of arc occurred in process chamber based on data processing at high speed.

SUMMARY OF THE INVENTION

An advantage of some aspects of the present invention is to provide a apparatus and method for detecting arc with accurate and effective monitoring performance by obtaining red, green, and blue color data of arc with RGB color sensor portion, and then by converting and analyzing the color data.

That is, above said arc detecting method using RF signal has a limit to determine only whether arc is occurred in process chamber or not.

However, by the present invention it is possible to determine occurrence of arc and figure out prelude phenomenon before occurrence of the arc by obtaining data of color, chroma, and brightness of arc.

And, said method for detecting arc using CCD camera has a problem to successively photograph and store image of inside of the chamber for analysis of image data.

However, the present invention uses RGB color sensor portion and obtains color, chroma, and brightness data of arc, and by AD converting and analyzing the data, quantity of data is remarkably reduced and data processing can be done at high speed.

Meanwhile, another advantage of some aspect of the present invention is to provide apparatus and method for detecting arc in which data processing and converting can be done at high speed by using plural AD converter converting analogue data sensed by the RGB color sensor portion to digital data, and thereby processing the data of each color in parallel.

Another advantage of some aspect of the present invention is to provide apparatus and method for detecting arc that can cope with various problems by detecting prelude phenomenon of arc based on data of arc.

An aspect of the apparatus according to present invention for detecting arc occurred in chamber for plasma treatment used for manufacturing semiconductor or LCD panel comprises, a sensor module for sensing the arc; a processor module for processing data from the sensor module; wherein the sensor module includes RGB color sensor portion for sensing color data of the arc occurred in the chamber, the RGB color sensor portion has a sensor sensable at least one of red color or green color or blue color of the arc, the apparatus detects the arc by sensing data of color and chroma and brightness of the arc.

Here, the apparatus for detecting arc may further comprise a converting module including at least one AD converter (Analogue to digital converter) for converting analog data sensed by the sensor module to digital data.

And, the RGB color sensor portion may include R sensor for sensing red color data of the arc, G sensor for sensing green color data of the arc, and B sensor for sensing blue color data of the arc, and the respective color data may be converted in the AD converter of the converting module in parallel.

Here, the sensor module may further include optical filter for accurate sensing of the RGB sensor by filtering wavelength of specific wavelength range.

And, the converting module may further include a storage portion for storing temporarily the digital data converted by the at least one AD converter and transmitting the data to the process module.

Meanwhile, the processor module may include, a data processing portion for transmitting rare data in which noise of digital data transmitted from the converting module is processed; a data analysis portion comparing intensity of the transmitted digital data and previously transmitted digital data and transmitting abnormality signal when the difference between the two data is over than a predetermined value; a processor for controlling the rare data transmitted from the data processing portion and the abnormality signal transmitted from the data analysis portion; a data transmitting portion transmitting data processed in the processor to terminal device; a data receiving portion receiving various data and control signal transmitted from the terminal device.

Here, the processor module may further include a condition display portion for displaying condition of the data processing portion, the data analysis portion, the processor, the data receiving portion, and the data transmitting portion, and a alarm portion for informing to operator when abnormality signal is transmitted from the data analysis portion.

And, communication of the terminal device, the data transmitting portion, and the data receiving portion may be high speed USB communication.

Meanwhile, the processor module may include at least one AD converter (Analogue to digital converter) for converting analogue data sensed by the sensor module to digital data.

Here, the RGB color sensor portion may include RGB data obtaining portion for obtaining red, green, and blue color data of the arc, and respective color data obtained by the RGB data obtaining portion may be extracted according to control signal of the processor module and converted in the AD converter.

And, the sensor module may further include optic filter filtering wavelength of specific wavelength range for accurate sensing of the RGB data obtaining portion.

Here, the processor module may include, a data processing portion for transmitting rare data in which noise of digital data transmitted from the AD converter is processed; a data analysis portion comparing intensity of the transmitted digital data and previously transmitted digital data and transmitting abnormality signal when the difference between the two data is over than a predetermined value; a processor for controlling the rare data transmitted from the data processing portion and the abnormality signal transmitted from the data analysis portion and for transmitting control signal to the RGB data obtaining portion; a data transmitting portion transmitting data processed in the processor to terminal device; a data receiving portion receiving various data and control signal transmitted from the terminal device.

And, the processor module may further include a condition display portion for displaying condition of the data processing portion, the data analysis portion, the processor, the data receiving portion, and the data transmitting portion, and an alarm portion for informing to operator when abnormality signal is transmitted from the data analysis portion.

Here, communication of the terminal device, the data transmitting portion, and the data receiving portion may be high speed USB communication.

And, Method for detecting arc occurred in chamber for plasma treatment used for manufacturing semiconductor or LCD panel according to present invention comprises a monitoring step S100 monitoring inside of the chamber with sensor module including RGB color sensor portion, a transmission step S200 transmitting color data of arc sensed by the sensor module to processor module, a processing step S300 processing transmitted color data in the processor module.

Here, the transmission step S200 transmitting color data of arc sensed by the sensor module to processor module may include, a converting step S210 converting analogue data sensed by the sensor module to digital data in converting module having at least one AD converter (Analogue to digital converter); a temporary storing step S220 storing converted digital data in storing portion; a transmission step S230 transmitting digital data stored in the storing portion to the processor module.

And, the RGB color sensor portion includes R sensor for detecting red color data of the arc, G sensor for detecting green color data of the arc, and B sensor for detecting blue color data of the arc, and the converting step S210 converting analogue data sensed by the sensor module to digital data in converting module having at least one AD converter may be a step converting respective color data in parallel in AD converter of the converting module.

Meanwhile, the processing step S300 processing the transmitted color data in the processor module may include, a rare data transmitting step S310 transmitting rare data in which noise is removed from digital data transmitted from the converter module; a abnormality signal transmitting step S320 transmitting abnormality signal when intensity difference between the transmitted rare data and previously transmitted rare data is more than a predetermined value; a data processing step S330 processing the transmitted rare data and the abnormality signal according to control of the processor; a transmission step S340 transmitting data processed in the processor to terminal device; a receiving step S350 receiving various data and control signals transmitted from terminal device.

Here, the processing step S300 processing the transmitted color data in the processor module may further include, a condition display step S360 displaying condition of data processing, data analysis, and data transmission and reception that are processed in the processor module, an alarm step S370 informing to operator when abnormality signal is transmitted.

Meanwhile, the RGB color sensor portion may include RGB data obtaining portion for obtaining red, green, and blue color data of the arc, and the transmission step S200 transmitting color data of arc sensed by the sensor module to processor module is a step in which respective color data obtained by the RGB data obtaining portion is extracted according to control signal of the processor module and transmitted to the processor module.

And, the processing step S300 processing the transmitted color data in the processor module may include, a converting step S301 converting analogue data transmitted from the sensor module to digital data in at least one AD converter included in the processor module; a rare data transmitting step S311 transmitting rare data in which noise is removed from converted digital data; a abnormality signal transmitting step S321 transmitting abnormality signal when intensity difference between the transmitted rare data and previously transmitted rare data is more than predetermined value; a data processing step S331 processing the transmitted rare data and the abnormality signal according to control of the processor; a transmission step S341 transmitting data processed in the processor to terminal device; a receiving step S351 receiving various data transmitted from terminal device of user and various control signal.

And, the processing step S300 processing the transmitted color data in the processor module may further include, a condition display step S361 displaying condition of data processing, data analysis, and data transmission and reception in the processor module, an alarm step S371 informing to operator when abnormality signal is transmitted.

DESCRIPTION OF SPECIFIC EMBODIMENTS

Hereinafter, embodiments of the present invention will be described in detail with reference to attached drawings.

Before the detailed description, it should be noted that the terms used in the present specification and the claims are not to be limited to their lexical meanings, but are to be interpreted to conform with the technical idea of the present invention under the principle that the inventor can properly define the terms for the best description of the invention made by the inventor.

Therefore, the embodiments and the constitution illustrated in the attached drawings are merely preferable embodiments according to the present invention, and thus they do not express all of the technical idea of the present invention, so that it should be understood that various equivalents and modifications can exist which can replace the embodiments described in the time of the application.

Figure 1:
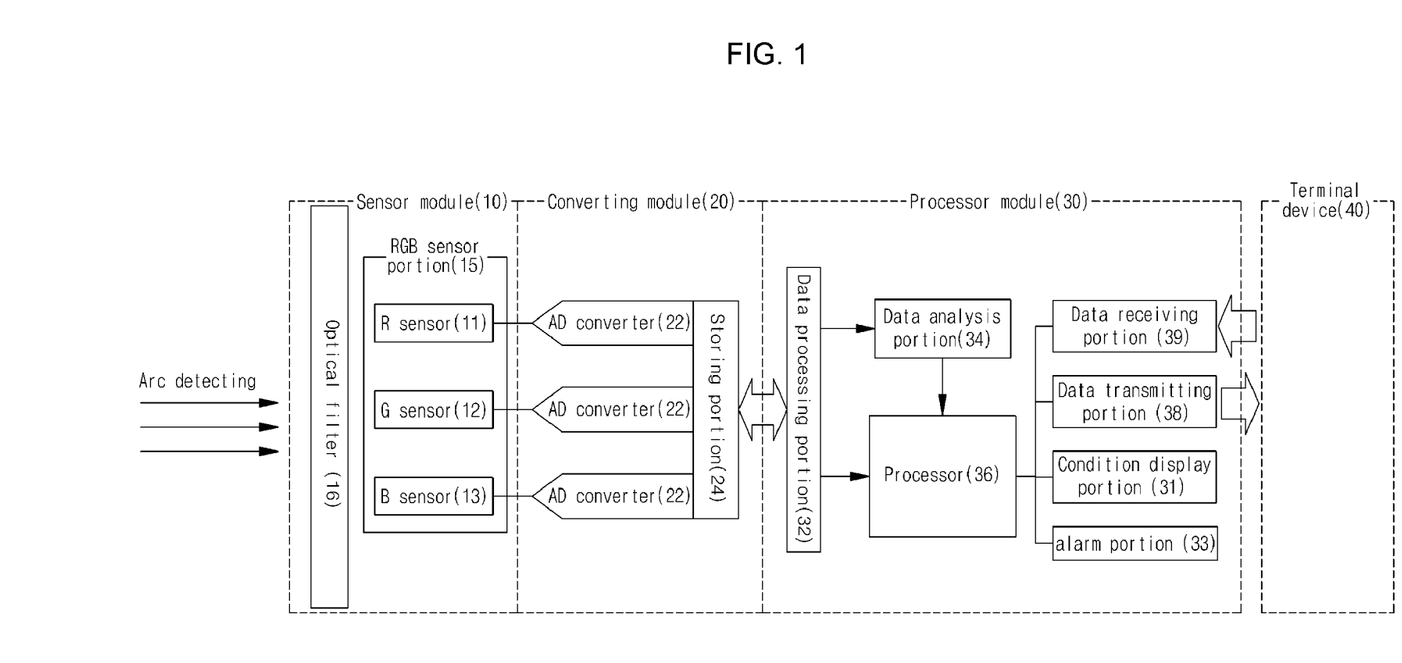
FIG. 1 is a block diagram of apparatus for detecting arc according to present invention.

FIG. 1 is a block diagram of apparatus for detecting arc according to present invention.

As seen in FIG. 1, the apparatus for detecting arc occurred in chamber for plasma treatment used for manufacturing semiconductor or LCD panel comprises, a sensor module 10 for sensing the arc, a processor module 30 for processing data from the sensor module 10, wherein the sensor module 10 includes RGB color sensor portion 15 for sensing color data of the arc occurred in the chamber, the RGB color sensor portion 15 is a sensor sensable at least one of red color or green color or blue color of the arc, thereby the apparatus detects the arc by sensing data of color and chroma and brightness of the arc.

Here, the apparatus for detecting arc according to present invention may further comprise a converting module 20 including at least one AD converter (Analogue to digital converter) for converting analog data sensed by the sensor module 10 to digital data.

That is, the apparatus for detecting arc may comprise sensor module 10 for detecting and sensing arc and converting module 20 for converting analogue data of the arc to digital sensed by the sensor module 10 and processor module 30 for processing and analyzing the digital data converted by the converting module 20.

Accordingly, the apparatus for detecting arc according to present invention measures only data value of color, chroma, and brightness of red, green, blue color of arc, and converts the measured data value to digital data in the converting module 20, and by analyzing and processing the digital data in the processor module 30, the apparatus effectively and precisely performs detecting prelude phenomenon of arc and analyzing arc with relatively small data quantity.

Here, the sensor module 10 may include RGB color sensor portion 15 and optical filter 16 for accurate estimation of the RGB color sensor portion 15.

The RGB color sensor portion 15 may include R sensor 11 for sensing red color data of the arc, G sensor 12 for sensing green color data of the arc, and B sensor 13 for sensing blue color data of the arc for respective color data.

That is, the RGB color sensor portion 15 performs detecting color data of arc occurred in processing chamber and transmitting the color data to the converting module 20.

And, the optical filter 16 filters wavelength of specific range, so interdict unnecessary wavelength for accurate estimation and detecting of arc and simultaneously protects the sensor portion.

The color data of arc detected by the sensor module 10 are transmitted to the converting module 20 and converted to digital data.

Here, the converting module 20 is a constitution for converting analogue data of arc transmitted from the sensor module 10 to digital data, and includes at least one AD converter 22 and a storage portion 24 for temporarily storing data converted by the AD converter.

That is, the AD converter may include plural AD converters 22 connected with the respective R sensor 11, G sensor 12, and B sensor 13, respective color data sensed by the sensors may be processed by the AD converter 22 in parallel.

Accordingly, as the data sensed by the respective sensors are converted to digital data respectively, data processing and analyzing can be rapidly performed, so arc monitoring capability of about 100 kHz (data gain by one hundred thousand per second) can be provided.

And, in FIG. 1, though three AD converters 22 are shown and connected to the R sensor 11, G sensor 12, and B sensor 13, however the number of the AD converter 22 is not limited to that, AD converters 22 of N number can be provided as desired.

Meanwhile, the storage portion 24 temporarily stores digital data converted by the AD converter 22, and transmit the data to processor module 30.

That is, the digital data converted by the AD converter 22 is stored temporarily in the storage portion 24, and after that the data is transmitted to the processor module 30 to be processed and analyzed.

Here, the processor module 30, as seen in FIG. 1, may include data processing portion 32, data analysis portion 34, processor 36, data transmitting portion 38, data receiving portion 39, condition display portion 31, and alarm portion 33.

Here, the data processing portion 32 is for processing noise of digital data transmitted from the converting module 20, so the data processing portion 32 dampens or eliminates noise by other detecting apparatus or transmission line.

And, data processing portion 32 transmits rare data in which noise is eliminated from digital data of arc to data analysis portion 34 and the processor 36.

Here, the data analysis portion 34 is for analyzing rare data transmitted from the data processing portion 32, and compares intensity of the transmitted rare data and previously transmitted rare data, so when difference between the two rare data is more than predetermined value, the data analysis portion transmits abnormal condition data to the processor 36.

Here, the previously transmitted rare data does not mean just previously transmitted rare data, but means rare data of specific range, that is rare data set of previous N msec.

That is, the data analysis portion 34 compare intensity of rare data transmitted from the data processing portion 32 with intensity of rare data transmitted for previous specific time range, and if the difference there between is more than a specific value, transmits abnormality signal to the data processor 36.

Accordingly, arc detecting device according to present invention can analyze prelude phenomenon that is shown before occurrence of arc and characteristic of arc by the data analysis, and can early prevent various problems.

Meanwhile, the processor 36 may be DSP (Digital Signal Processor Chip) or AD chip of high capacity for processing and controlling abnormal condition signal transmitted from the data analysis portion 34 and rare data transmitted from the data processing portion 32.

And, the data transmitting portion 38 is for transmitting data processed in the processor 36 to user terminal device, the data receiving portion 39 receives data and control signal transmitted from the user terminal device and transmits them to the processor 36.

And, the condition display portion 31 displays condition of the data processing portion 32, the data analysis portion 34, the processor 36, the data receiving portion 39, the data transmission portion 38, the sensor module 10 and the converting module 20.

And, the alarm portion 33 gives alarm to operator when abnormal condition signal for arc is transmitted from the data analysis portion 34.

Here, for communication of the terminal device 40 of user, the data transmission portion 38, and the data receiving portion 39, various communication type can be available, preferably USB communication can be used.

And, the data transmission portion 38 can be provided to transmit rare data transmitted from the data processing portion 32 and abnormality signal transmitted from the data analysis portion 34 to terminal device 40 of user by control of the processor 36.

Hereinafter, method for detecting arc according to present invention will be described in detail.

Method for detecting arc according to present invention is for detecting arc occurred in chamber for plasma treatment used for manufacturing semiconductor or LCD panel comprising, a monitoring step S100 monitoring inside of the chamber with sensor module including RGB color sensor portion, a transmission step S200 transmitting color data of arc sensed by the sensor module to processor module, a processing step S300 processing the transmitted color data in the processor module.

Here, the RGB color sensor portion includes R sensor for detecting red color data of the arc, G sensor for detecting green color data of the arc, and B sensor for detecting blue color data of the arc.

And, the transmission step S200 transmitting color data of arc sensed by the sensor module to processor module includes a converting step S210 converting analogue data sensed by the sensor module to digital data in converting module having at least one AD converter, a temporary storing step S220 storing the converted digital data in storing portion, a transmission step S230 transmitting stored digital data to the processor module.

Here, the converting step S210 converting analogue data sensed by the sensor module to digital data in converting module having at least one AD converter is a step converting respective color data in parallel in AD converter of the converting module.

That is, method for detecting arc according to present invention can be provided by a process in which if arc is detected in the monitoring step S100, detected analogue data of arc is converted 5210 to digital data, and then the digital data is stored 5220 in storing portion, after that the stored data is transmitted 5230 to processor module.

Meanwhile, the processing step S300 processing the transmitted color data in the processor module may include noise removing step S310 removing noise of data, a data analysis step S320, a data processing step S330, a transmission step S340, a receiving step S350, a condition display step S360, an alarm step S370.

Here, in the noise removing step S310, rare data in which noise is removed from digital data transmitted from the converting module is transmitted to data processing portion and processor.

Here, the noise is by other detecting apparatus or transmission line, in the noise removing step 310, rare data in which noise is dampened or removed can be provided.

And, in the data analysis step S320, intensity of the transmitted rare data and previously transmitted rare data are compared, and if difference between the two rare data is more than a predetermined value, abnormal condition signal is transmitted.

Here, the previously transmitted rare data does not mean just previously transmitted rare data, but means rare data of specific range, that is rare data set of previous N msec.

That is, in the data analysis step S320, intensity of transmitted rare data and intensity of rare data transmitted for a specific previous time range are compared, and if the difference there between is more than a specific value, abnormal condition signal is transmitted to the processor.

And, the data processing step S330 is a step processing the transmitted rare data and the abnormal condition signal according to control of the processor, and the transmission step S340 is a step transmitting data (rare data, abnormality signal, analysis data, etc.) processed in the processor to terminal device of user.

And, in the receiving step S350, various data and control signal transmitted from terminal device of user is received and transmitted to the processor, and in the condition display step S360, condition of data processing, data analysis, and data transmission and reception in the processor module is displayed.

And, in the alarm step S370, when abnormal condition signal is transmitted in the 5320 step, that is informed to operator.

Figure 2:
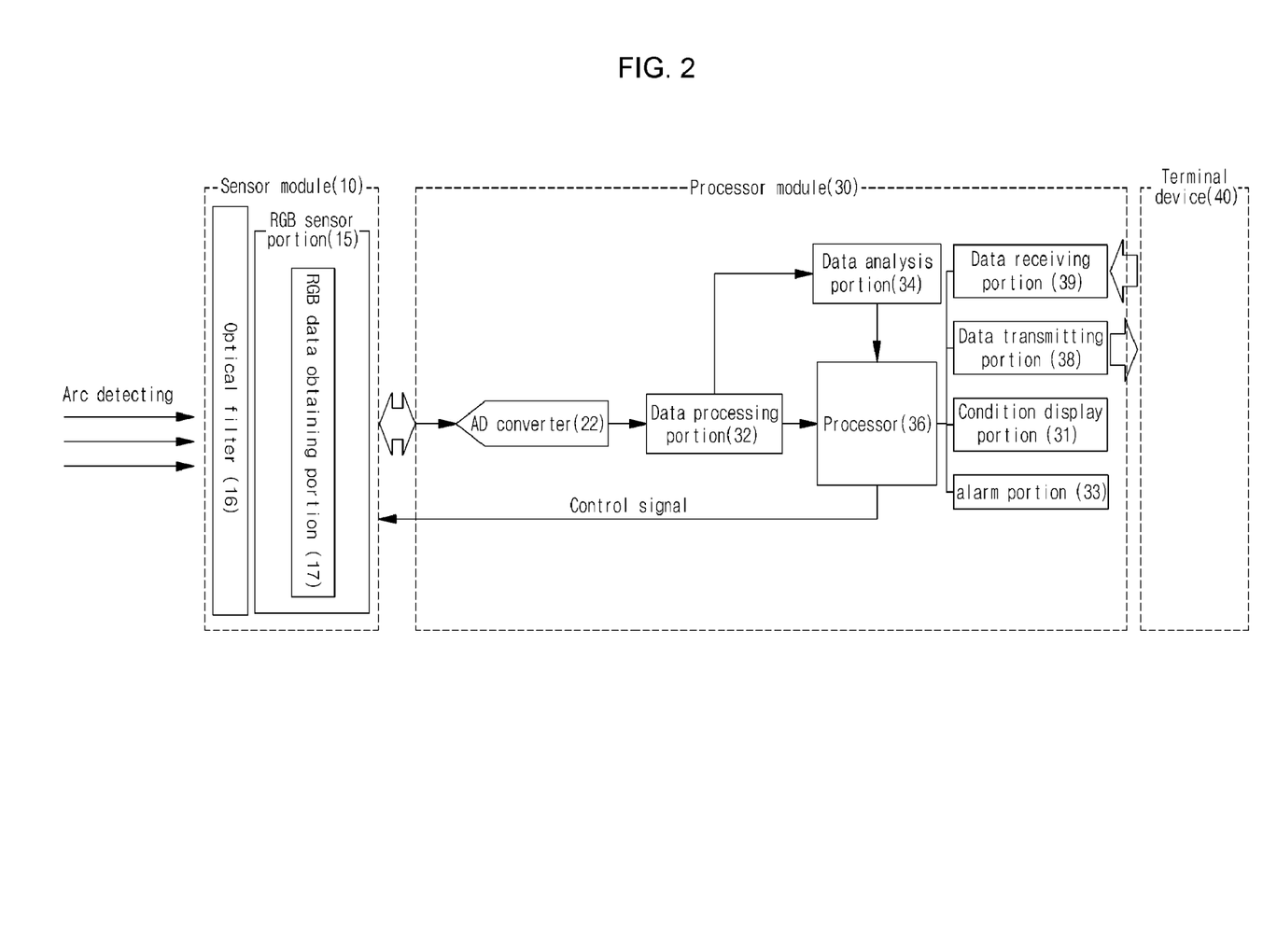
FIG. 2 is a block diagram of apparatus for detecting arc according to another embodiment of the present invention.

FIG. 2 is a block diagram of another embodiment of arc detecting apparatus according to present invention.

Referring to FIG. 2, the apparatus for detecting arc occurred in chamber for plasma treatment used for manufacturing semiconductor or LCD panel comprises, a sensor module 10 for sensing the arc, a processor module 30 for processing data from the sensor module 10, wherein the sensor module 10 includes RGB color sensor portion 15 for sensing color data of the arc occurred in the chamber, the RGB color sensor portion 15 is a sensor sensable at least one of red color or green color or blue color of the arc, thereby the apparatus detects the arc by sensing data of color and chroma and brightness of the arc.

Here, the processor module 30 may include at least one AD converter (Analogue to digital converter) for converting analog data sensed by the sensor module 10 to digital data.

That is, the apparatus for detecting arc may include sensor module 10 for detecting and sensing arc and processor module 30 for converting analogue data to digital data of the arc sensed by the sensor module 10 and for processing and analyzing the digital data.

Accordingly, the apparatus for detecting arc according to another embodiment of the present invention measures only numeric value of color, chroma, and brightness of red, green, blue color of arc with sensor module 10 that have the RGB color sensor portion 15, and by converting and analyzing the measured data in the processor module 30, the apparatus effectively and precisely performs detection of prelude phenomenon of arc and analyzing arc with relatively small data quantity.

Here, the sensor module 10 may include RGB color sensor portion 15 and optical filter 16 for accurate estimation of the RGB color sensor portion 15.

And, the RGB color sensor portion 15 may include RGB data obtaining portion 17 for sensing red color data, green color data, and blue color data of the arc.

That is, the RGB color sensor portion 15 performs detecting color data of arc with the RGB data obtaining portion 17 and transmits the color data to the processor module 30.

And, the optical filter 16 filters wavelength of specific range that is deliverable to the RGB data obtaining portion 17, so interdict unnecessary wavelength for accurate estimation and detecting of arc and simultaneously protects the sensor portion.

Here, the color data of arc sensed by the sensor module 10 is transmitted to the processor module 20 and converted to digital data in AD converter 22 that is included in the processor module 30.

That is, the AD converter may be connected to the RGB data obtaining portion 17, and data of respective color sensed by the RGB data obtaining portion 17 may be extracted and converted in the AD converter 22 by the control signal of the processor module 30.

And, in FIG. 2, though one AD converter 22 is shown to be connected to the RGB data obtaining portion 17, however plural AD converters 22 may be connected to the data obtaining portion 17 in parallel.

Accordingly, among the data obtained by the RGB data obtaining portion 17, selectively extracted data according to the control signal sent from the processor module 30 is converted, so data processing and analysis can be performed rapidly.

And, in FIG. 2, the AD converter 22 is shown to be independently installed outside of processor 36 in the processor module 30, the AD converter 22 may be at least one installed in the processor 36.

Meanwhile, the processor module 30, as seen in FIG. 2, may include AD converter 22, data processing portion 32, data analysis portion 34, processor 36, data transmitting portion 38, data receiving portion 39, condition display portion 31, and alarm portion 33.

Here, the data processing portion 32 is for processing noise of digital data transmitted from the AD converter 22, so the data processing portion 32 dampens or eliminates noise by other detecting apparatus or transmission line.

And, the data processing portion 32 eliminates noise from digital data of arc transmitted from the AD converter 22 to make rare data and transmits the rare data in which noise is eliminated to the data analysis portion 34 and the processor 36.

Here, the data analysis portion 34 is for analyzing rare data transmitted from the data processing portion 32, and compares intensity of the transmitted rare data and previously transmitted rare data, so when difference between the two rare data is more than a predetermined value, the data analysis portion transmits abnormal condition signal to the processor 36.

Here, the previously transmitted rare data does not mean just previously transmitted rare data, but means rare data of specific range, that is rare data set of previous N msec.

That is, the data analysis portion 34 compare intensity of rare data transmitted from the data processing portion 32 with intensity of rare data transmitted for a specific previous time range, and if the difference there between is more than a specific value, transmits abnormal condition signal to the processor 36.

Accordingly, arc detecting device according to the embodiment can analyze prelude phenomenon that is shown before occurrence of arc and characteristic of arc by the data analysis, and can early prevent various problems.

Meanwhile, the processor 36 controls the rare data transmitted from the data processing portion 32 and abnormal condition signal transmitted from the data analysis portion 34 and transmits control signal to the RGB data obtaining portion 17.

Here, the processor 36 may be DSP (Digital Signal Processor Chip) or AD chip of high capacity to perform data processing rapidly, and may include the AD converter 22.

And, the data transmitting portion 38 is for transmitting data processed in the processor 36 to user terminal device, and the data receiving portion 39 receives data and control signal transmitted from the user terminal device and transmits them to the processor 36.

And, the condition display portion 31 displays condition of the AD converter 22, the data processing portion 32, the data analysis portion 34, the processor 36, the data receiving portion 39, the data transmission portion 38, and the sensor module 10.

And, the alarm portion 33 gives alarm to operator when abnormal condition signal for arc is transmitted from the data analysis portion 34.

Here, for communication of the terminal device 40 of user, the data transmission portion 38, and the data receiving portion 39, various communication type can be available, preferably USB communication of high speed can be used.

And, the data transmitting portion 38 can be provided to transmit rare data transmitted from the data processing portion 32 and abnormal condition signal transmitted from the data analysis portion 34 to terminal device 40 of user by control of the processor 36.

Hereinafter, method for detecting arc according to another embodiment of the present invention will be described in detail.

Method for detecting arc according to another embodiment of the present invention is for detecting arc occurred in chamber for plasma treatment used for manufacturing semiconductor or LCD panel comprising, a monitoring step S100 monitoring inside of the chamber with sensor module including RGB color sensor portion, a transmission step S200 transmitting color data of arc sensed by the sensor module to processor module, and a processing step S300 processing the transmitted color data in the processor module.

Here, the RGB color sensor portion may include RGB data obtaining portion obtaining red color, green color, and blue color data of the arc.

And, in the transmission step S200 transmitting color data of arc sensed by the sensor module to the processor module, respective color sensed by the RGB data obtaining portion 17 may be extracted and transmitted to the processor module by control signal of the processor module.

That is, in the step S200, the sensor module extracts color data selected by the control signal from the processor and transmits the color data to the processor module.

That is, method for detecting arc according to the embodiment can be provided by a process in which if arc is detected in the monitoring step S100, color data is extracted by control signal of the processor to be transmitted 5200 to the processor module.

Meanwhile, the processing step S300 processing the transmitted color data in the processor module may include data converting step S311, data noise removing step S311, a data analysis step S321, a data processing step S331, a transmission step S341, a receiving step S351, a condition display step S361, an alarm step S371.

Here, in the data converting step S311, analogue data of color transmitted from the sensor module is converted S311 to digital data.

And, in the data noise removing step S311, rare data in which noise is removed from digital data transmitted from the AD converter is transmitted S311 to the data processing portion and the processor.

Here, the noise is by other detecting apparatus or transmission line, in the step 311, rare data in which noise is dampened or removed can be provided.

And, in the data analysis step S321, intensity of the transmitted rare data and previously transmitted rare data are compared, and if difference between the two rare data is more than a predetermined value, abnormal condition signal is transmitted S321.

Here, the previously transmitted rare data does not mean just previously transmitted rare data, but means rare data of specific range, that is rare data set of previous N msec.

That is, in the data analysis step S321, intensity of rare data transmitted and intensity of rare data transmitted for a specific previous time range are compared, and if the difference there between is more than a specific value, abnormal condition signal is transmitted to the processor.

And, the data processing step S330 is a step processing the transmitted rare data and the abnormal condition signal according to control of the processor, and transmitting control signal for the color data to be extracted to the sensor module.

And, the transmission step S341 is a step transmitting data (rare data, abnormal condition signal, analysis data, etc.) processed in the processor to terminal device of user.

Here, in the receiving step S350, various data and control signal transmitted from terminal device of user are received and transmitted to the processor, and in the condition display step S360, condition of data converting, data processing, data analysis, and data transmission and reception in the processor module is displayed.

And, in the alarm step S371, when abnormal condition signal is transmitted in the 5321 step, that is informed to operator.

Hereinafter, monitoring performance of apparatus for detecting arc according to the present invention and figuring out prelude phenomenon of arc will be described in detail with reference to the FIG. 3(a), 3(b), 3(c) and FIG. 4(a), 4(b), 4(c).

Figure 3A:
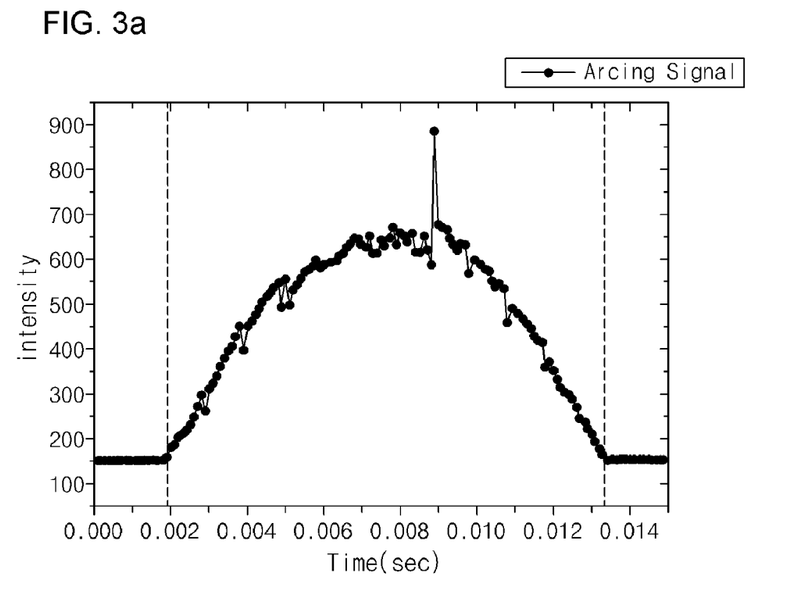
FIGS. 3a and 3b are graphs in which macro arcing of green color is detected by the arc detecting apparatus according to present invention.
Figure 3B:
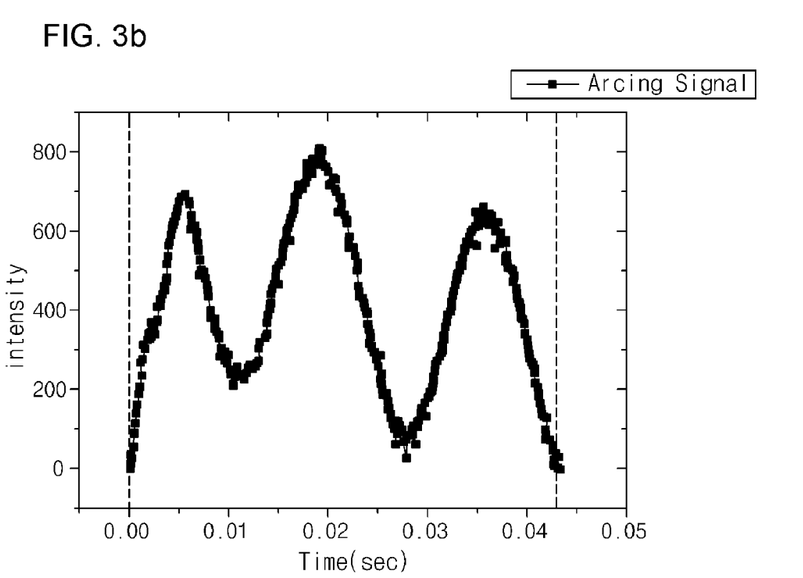
Figure 3C:
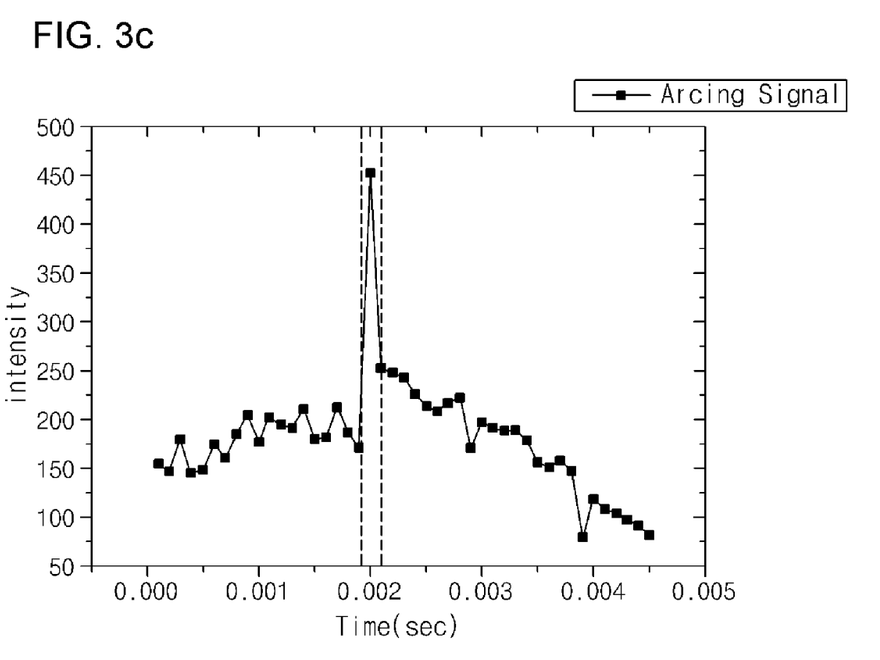
FIG. 3c is a graph in which micro arcing of green color is detected by the arc detecting apparatus according to present invention.
Figure 4A:
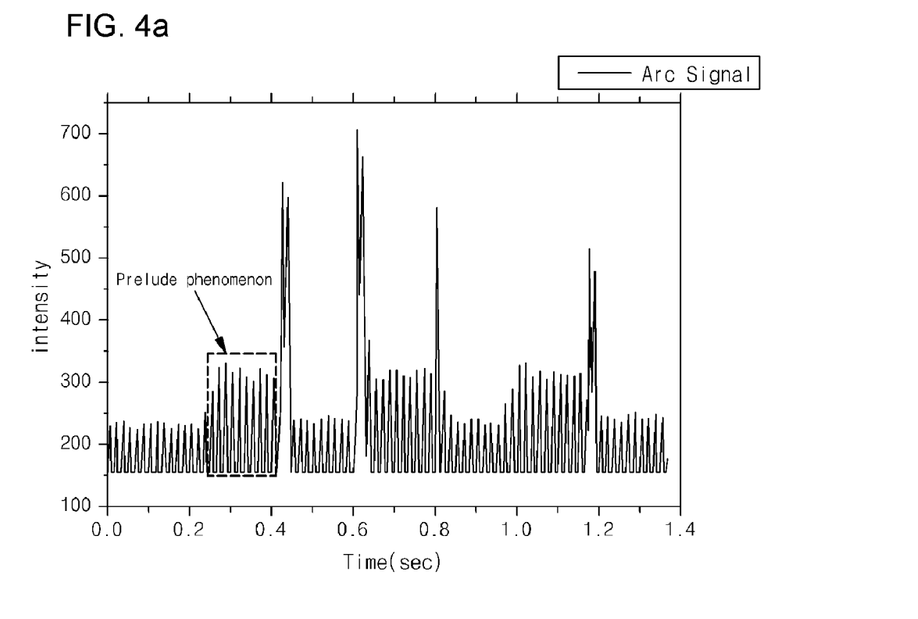
FIGS. 4a-4c are graphs of red, green, blue color data of arc detected by the arc detecting apparatus according to present invention.

FIG. 3(a) and (b) are graphs in which macro arcing of green color is detected by the arc detecting apparatus according to present invention, and FIG. 3(c) is a graph in which micro arcing of green color is detected by the arc detecting apparatus according to present invention, and FIG. 4(a), (b), (c) are graphs of red, green, blue color data of arc detected by the arc detecting apparatus according to present invention.

FIG. 3(a) is a arcing graph converted from green color data sensed by RGB color sensor portion, one macro arc is detected for 0.01 sec {0.002~0.012 (sec)}.

And, FIG. 3(b) is a arcing graph converted from green color data sensed by RGB color sensor portion, three macro arcs are detected for 0.05 sec {0~0.05 (sec)}.

And, FIG. 3(c) a arcing graph converted from green color data sensed by RGB color sensor portion, one micro arc is detected for 0.0001 sec.

That is, arc detecting apparatus according to the invention, data obtaining performance per second is outstanding, and data is processed very rapidly, so the apparatus shows monitoring performance that can detect macro arc which has relatively long occurrence time and micro arc which has relatively short occurrence time all together.

Figure 4B:
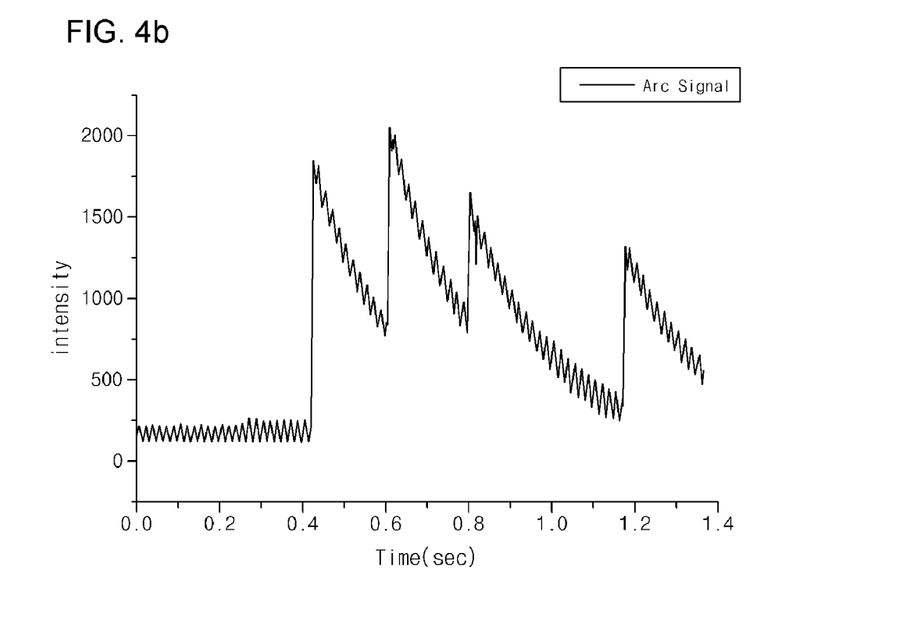
Figure 4C:
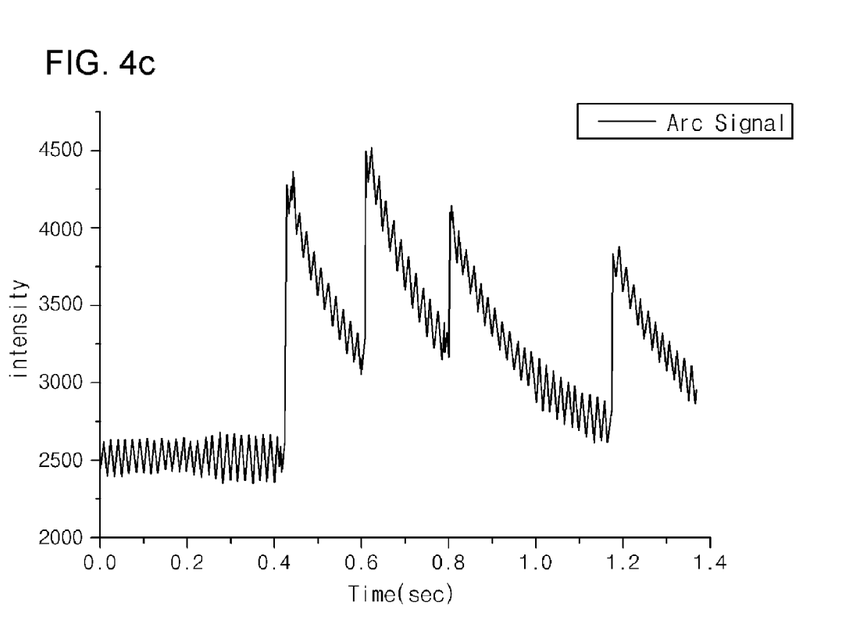

FIG. 4(a), (b), (c) is graphs in which each color data of red, green, blue is converted during four arcs sensed by RGB color sensor portion.

In FIG. 4(a), before occurrence of arc, approximately during 0.25~0.4 (sec), signal intensity of 1.5~2 times of previously estimated intensity during {0~0.25 (sec)} is estimated, and that can be judged to be prelude phenomenon of arc occurrence.

Though, apparent prelude phenomenon as in FIG. 4(a) was not shown in FIG. 4(b) and FIG. 4(c), in the range of {0.25~0.4 (sec)} where prelude phenomenon is shown in FIG. 4(a), the intensity is changed in small.

That is, if prelude phenomenon shown in FIG. 4(a) is sensed, that is processed in the data analysis portion of the invention, and abnormal condition signal is transmitted to the processor, thereby problems can be prevented early.

As mentioned above, the apparatus and method for detecting arc occurred in process chamber for plasma treatment according to the present invention uses RGB color sensor portion, and thereby color data of arc can be obtained at high speed.

And, by using plural AD converters converting analogue data sensed by the RGB color sensor portion to digital data, data conversion for respective color are processed in parallel, so data conversion and process are performed at high speed and easily.

And, by detecting prelude phenomenon of arc based on the converted and processed data of arc, various problems can be coped with early.

Although the present invention has been described with reference to the specified examples in the above, but the idea of the present invention is not limited to the above described matters and various changes and modifications can be made within the equivalent scope of the present invention and the following claims by the ordinary-skilled person of the art.

What is claimed is:

1. An apparatus for detecting arc occurred in chamber for plasma treatment used for manufacturing semiconductor or LCD panel comprising:
   a sensor module for sensing the arc;
   a processor module for processing data from the sensor module;
   wherein the sensor module includes RGB color sensor portion for sensing color data of the arc occurred in the chamber, the RGB color sensor portion has a sensor sensable at least one of red color or green color or blue color of the arc, the apparatus detects the arc by sensing data of color and chroma and brightness of the arc.

2. The apparatus for detecting arc according to claim 1, further comprising a converting module including at least one AD converter (Analogue to digital converter) for converting analog data sensed by the sensor module to digital data.

3. The apparatus for detecting arc according to claim 2, wherein the RGB color sensor portion includes R sensor for sensing red color data of the arc, G sensor for sensing green color data of the arc, and B sensor for sensing blue color data of the arc, and the respective color data are converted in the AD converter of the converting module in parallel.

4. The apparatus for detecting arc according to claim 3, wherein the sensor module further includes optical filter for accurate sensing of the RGB sensor by filtering wavelength of specific wavelength range.

5. The apparatus for detecting arc according to claim 4, the converting module further includes a storage portion for storing temporarily the digital data converted by the at least one AD converter and transmitting the data to the process module.

6. The apparatus for detecting arc according to claim 5, wherein the processor module includes,
a data processing portion for transmitting rare data in which noise of digital data transmitted from the converting module is processed;
a data analysis portion comparing intensity of the transmitted digital data and intensity of previously transmitted digital data and transmitting abnormal condition signal when the difference between the two data is over than a predetermined value;
a processor for controlling the rare data transmitted from the data processing portion and the abnormal condition signal transmitted from the data analysis portion;
a data transmitting portion transmitting data processed in the processor to terminal device; and
a data receiving portion receiving various data and control signal transmitted from the terminal device.

7. The apparatus for detecting arc according to claim 6, wherein the processor module further includes a condition display portion for displaying condition of the data processing portion, the data analysis portion, the processor, the data receiving portion, and the data transmitting portion, and a alarm portion for informing to operator when abnormal condition signal is transmitted from the data analysis portion.

8. The apparatus for detecting arc according to claim 7, wherein communication of the terminal device, the data transmitting portion, and the data receiving portion is high speed USB communication.

9. The apparatus for detecting arc according to claim 1, wherein the processor module includes at least one AD converter (Analogue to digital converter) for converting analogue data sensed by the sensor module to digital data.

10. The apparatus for detecting arc according to claim 9, wherein the RGB color sensor portion includes RGB data obtaining portion for obtaining red, green, and blue color data of the arc, and respective color data obtained by the RGB data obtaining portion is extracted according to control signal of the processor module and converted in the AD converter.

11. The apparatus for detecting arc according to claim 10, wherein the sensor module further includes optical filter filtering wavelength of specific wavelength range for accurate sensing of the RGB data obtaining portion.

12. The apparatus for detecting arc according to claim 11, wherein the processor module includes, a data processing portion for transmitting rare data in which noise of digital data transmitted from the AD converter is processed;
a data analysis portion comparing intensity of the transmitted digital data and intensity of previously transmitted digital data and transmitting abnormal condition signal when the difference between the two data is over than a predetermined value;
a processor for controlling the rare data transmitted from the data processing portion and the abnormal condition signal transmitted from the data analysis portion and for transmitting control signal to the RGB data obtaining portion;
a data transmitting portion transmitting data processed in the processor to terminal device; and
a data receiving portion receiving various data and control signal transmitted from the terminal device.

13. The apparatus for detecting arc according to claim 12, wherein the processor module further includes a condition display portion for displaying condition of the data processing portion, the data analysis portion, the processor, the data receiving portion, and the data transmitting portion, and a alarm portion for informing to operator when abnormality signal is transmitted from the data analysis portion.

14. The apparatus for detecting arc according to claim 13, wherein communication of the terminal device, the data transmitting portion, and the data receiving portion is high speed USB communication.

15. Method for detecting arc occurred in chamber for plasma treatment used for manufacturing semiconductor or LCD panel comprising, a monitoring step (S100) monitoring inside of the chamber with sensor module including RGB color sensor portion, a transmission step (S200) transmitting color data of arc sensed by the sensor module to processor module, a processing step (S300) processing the transmitted color data in the processor module.

16. Method for detecting arc according to claim 15, wherein the transmission step (S200) transmitting color data of arc sensed by the sensor module to processor module includes, a converting step (S210) converting analogue data sensed by the sensor module to digital data in converting module having at least one AD converter;
a temporary storing step (S220) storing the converted digital data in storing portion; and
a transmission step (S230) transmitting the stored digital data to the processor module.

17. Method for detecting arc according to claim 15, wherein the RGB color sensor portion includes R sensor for detecting red color data of the arc, G sensor for detecting green color data of the arc, and B sensor for detecting blue color data of the arc, and the converting step (S210) converting analogue data sensed by the sensor module to digital data in converting module having at least one AD converter is a step converting respective color data in parallel in AD converter of the converting module.

18. Method for detecting arc according to claim 17,
wherein the processing step (S300) processing the transmitted color data in the processor module includes, a rare data transmitting step (S310) transmitting rare data in which noise is removed from digital data transmitted from the converter module;
a abnormal condition signal transmitting step (S320) transmitting abnormal condition signal when intensity difference between the transmitted rare data and previously transmitted rare data is more than a predetermined value;
a data processing step (S330) processing the transmitted rare data and the abnormal condition signal according to control of the processor;
a transmission step (S340) transmitting data processed in the processor to terminal device; and
a receiving step (S350) receiving various data and control signal transmitted from terminal device of user.

19. Method for detecting arc according to claim 18, wherein the processing step (S300) processing the transmitted color data in the processor module further includes, a condition display step (S360) displaying condition of data processing, data analysis, and data transmission and reception in the processor module, an alarm step (S370) informing to operator when abnormal condition signal is transmitted.

20. Method for detecting arc according to claim 15,
wherein the RGB color sensor portion includes RGB data obtaining portion for obtaining red, green, and blue color data of the arc, and the transmission step (S200) transmitting color data of arc sensed by the sensor module to processor module is a step in which respective color data obtained by the RGB data obtaining portion is extracted according to control signal of the processor module and is transmitted to the processor module.

21. Method for detecting arc according to claim 20, wherein the processing step (S300) processing the transmitted color data in the processor module includes, a converting step (S301) converting analogue data transmitted from the sensor module to digital data in at least one AD converter included in the processor module;
- a rare data transmitting step (S311) transmitting rare data in which noise is removed from converted digital data
- a abnormal condition signal transmitting step (S321) transmitting abnormality signal when intensity difference between the transmitted rare data and previously transmitted rare data is more than a predetermined value;
- a data processing step (S331) processing the transmitted rare data and the abnormal condition signal according to control of the processor;
- a transmission step (S341) transmitting data processed in the processor to terminal device; and
- a receiving step (S351) receiving various data and control signal transmitted from terminal device of user.

22. Method for detecting arc according to claim 21, wherein the processing step (S300) processing the transmitted color data in the processor module further includes, a condition display step (S361) displaying condition of data processing, data analysis, and data transmission and reception in the processor module, an alarm step (S371) informing to operator when abnormal condition signal is transmitted.

* * * * *